(12) United States Patent
Iwane

(10) Patent No.: US 8,598,692 B2
(45) Date of Patent: Dec. 3, 2013

(54) SEMICONDUCTOR DEVICE AND METHOD FOR MANUFACTURING SAME

(75) Inventor: Tomohiko Iwane, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 13/398,910

(22) Filed: Feb. 17, 2012

(65) Prior Publication Data
US 2012/0211877 A1 Aug. 23, 2012

(30) Foreign Application Priority Data
Feb. 23, 2011 (JP) ................................. 2011-037573

(51) Int. Cl.
H01L 23/495 (2006.01)

(52) U.S. Cl.
USPC ........... 257/668; 257/666; 257/686; 257/698; 257/789; 438/123; 438/126

(58) Field of Classification Search
USPC ........... 257/668, 666, 686, 698, 789, E23.01, 257/E21.506; 438/123, 126
See application file for complete search history.

(56) References Cited

U.S. PATENT DOCUMENTS

| 6,153,930 A | 11/2000 | Hori |
| 6,368,895 B1 | 4/2002 | Hori |
| 7,514,296 B2 * | 4/2009 | Tajimi ........................... 438/123 |
| 2005/0110049 A1 | 5/2005 | Urushido |

FOREIGN PATENT DOCUMENTS

| JP | 09-232474 | 9/1997 |
| JP | 11214586 A | 8/1999 |
| JP | 2003-347366 | 12/2003 |
| JP | 2004349399 A | 12/2004 |
| JP | 2005-129846 | 5/2005 |
| JP | 2005175113 A | 6/2005 |
| JP | 2009004710 A | 1/2009 |
| JP | 2011-018927 | 1/2011 |

* cited by examiner

Primary Examiner — Theresa T Doan
(74) Attorney, Agent, or Firm — Harness, Dickey & Pierce, P.L.C.

(57) ABSTRACT

A semiconductor device includes (i) a tape base material, (ii) a wiring pattern, (iii) a semiconductor element which is electrically connected with the wiring pattern, (iv) a top-side insulating protective film which covers a top surface of the tape base material and has an top-side opening section provided in a region where the top-side insulating protective film faces the semiconductor element, and (v) a reverse-side insulating protective film which covers a reverse surface of the tape base material and has a reverse-side opening section provided on a reverse side below the top-side opening section. The top-side insulating protective film has a protruding opening section extending outwardly from the region. An opening of the reverse-side opening section is 1.00 time to 8.50 times larger in an area than the region.

7 Claims, 7 Drawing Sheets

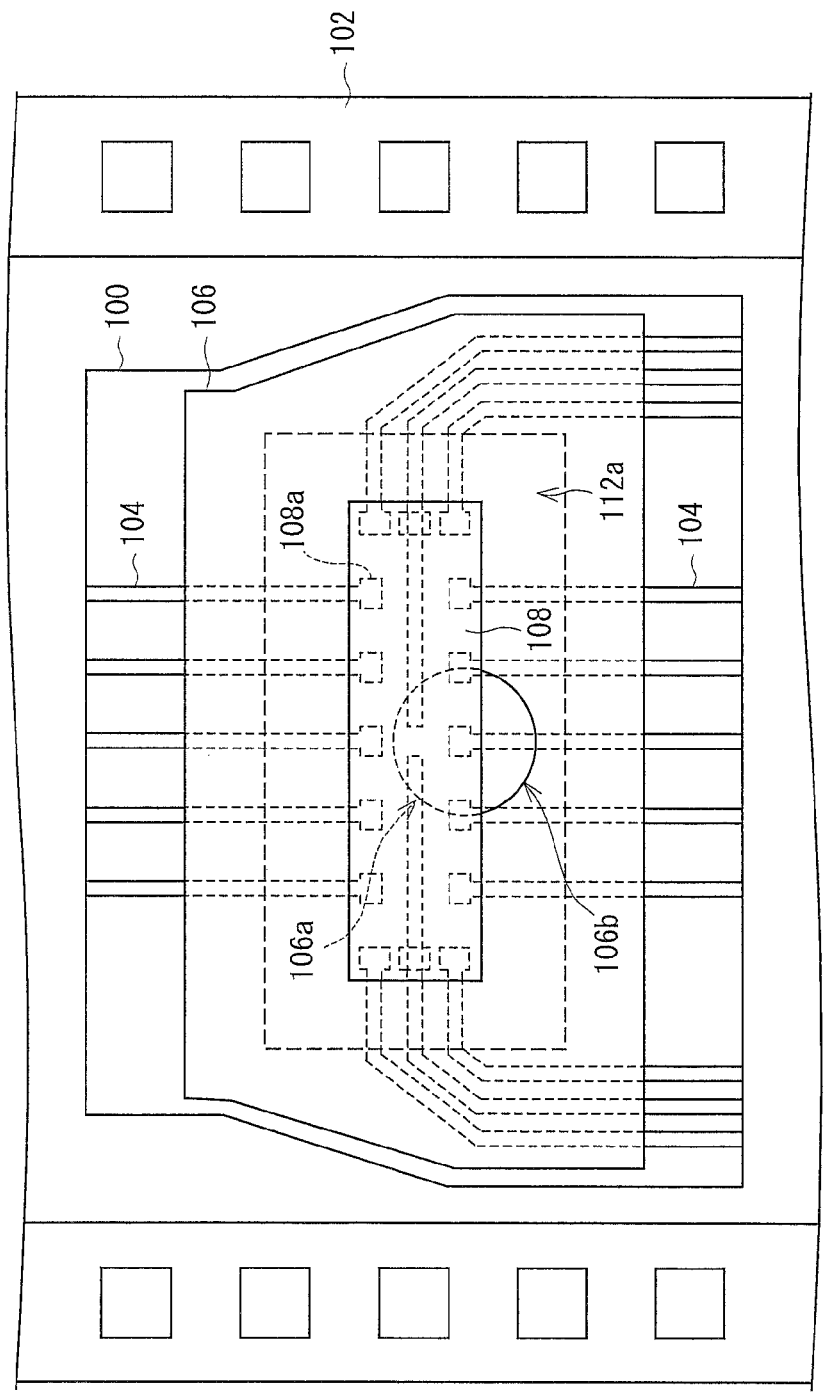
F I G. 6

SEMICONDUCTOR DEVICE AND METHOD FOR MANUFACTURING SAME

This Nonprovisional application claims priority under 35 U.S.C. §119(a) on Patent Application No. 2011-037573 filed in Japan on Feb. 23, 2011, the entire contents of which are hereby incorporated by reference.

TECHNICAL FIELD

The present invention relates to a tape carrier type semiconductor device and a method for manufacturing the same.

BACKGROUND ART

Recently, many manufacturing processes of semiconductor devices adopt an art of sealing electronic components on a substrate with a resin, for the purpose of more securely fixing the electronic components (mainly semiconductor elements or the like) provided on the substrate. In the manufacturing processes adopting the art of sealing, it is desirable to more efficiently seal the electronic components with the resins, in order to attain higher quality of the semiconductor devices, lower manufacturing cost, shorter manufacturing periods, and the like.

Various arts of improving the sealing efficiencies have been disclosed in relation with the art of sealing the electronic component on the substrate with the resin.

For example, Patent Literature 1 describes an art in which a fence larger than a bear chip is provided around a region to which the bear chip is to be provided on a wiring board, in order to prevent a resin from widely spreading out of the region when the bear chip on the wiring board is sealed with the resin.

Patent Literature 2 describes an art in which a solder resist section has a trench part for impounding therein a liquid resin so as to prevent, if more than a required amount of the liquid resin is fed, the liquid resin from overflowing to a substrate.

Patent Literature 3 describes an art in which a gap (clearance) between (i) each side of an outer shape of an IC chip and (ii) a peripheral part of an opening in an insulating protective film is set to 0.2 mm to 0.5 mm.

Patent Literature 4 describes an art of preventing an underfilling resin from being easily exfoliated from a flexible substrate when the flexible substrate is bent. According to the art of Patent Literature 4, (i) an opening section of an insulating protective film is provided in a region outer than a region where an electronic component is mounted, i.e., a region where an applied force is concentrated most, and (ii) the underfilling resin is firmly adhered to the flexible substrate in the opening section.

(Conventional Semiconductor Device)

The following describes a conventional semiconductor device which employs the art in which the electronic component provided on the substrate is sealed with the resin. FIG. 7 is a view showing a top side of a conventional semiconductor device 700. FIG. 8 is a view showing a lateral cross section of the conventional semiconductor device 700.

As shown in FIGS. 7 and 8, the semiconductor device 700 includes a substrate 702, a wiring pattern 704, an insulating protective film 706, and a semiconductor element 708. Each of FIGS. 7 and 8 shows the semiconductor device 700 for which a filling agent 710 (which is later discussed in FIG. 9) has not been applied yet.

The substrate 702 is a so-called flexible substrate, which is flexible. The wiring pattern 704 is provided on a surface of the substrate 702. The surface of the substrate 702 on which the wiring pattern 704 is provided is covered with the insulating protective film 706 which has an insulting property.

The insulting protective film 706 has an opening section 706a provided in a region where the semiconductor element 708 is provided. In this conventional example, the semiconductor element 708 has a rectangular outer shape. Accordingly, the opening section 706a has a rectangular shape substantially same as the outer shape of the semiconductor element 708.

The opening section 706a has a size greater than the semiconductor element 708. Specifically, each side of the rectangular shape of the opening part 706a is longer in length than a corresponding side of the rectangular shape of the semiconductor element 708 by 0.4 mm to 1.0 mm. As such, a space d1 between a peripheral part of the opening section 706a and a peripheral part of the semiconductor element 708 is set to 0.2 mm to 0.5 mm.

The semiconductor element 708 is provided on the surface of the substrate 702 within the opening section 706a, and is connected with the wiring pattern 704 via an electrode 708a of the semiconductor element 708.

(Feeding of with Filling Agent 710)

Further, in the conventional semiconductor device 700 shown in FIGS. 7 and 8, the filling agent 710 (see FIG. 9) is fed so as to attain the aforementioned objective. FIG. 9 is a view showing, in magnification, the lateral cross section of the conventional semiconductor device 700 for which the filling agent 710 has already been fed. Specifically, after mounting of the semiconductor element 708 on the substrate 702, the filling agent 710 is fed to an inside of the opening section 706a provided on the substrate 702.

A dispenser 900 is used for feeding the filling agent 710. The dispenser 900 is loaded with a sufficient amount of the filling agent 710 in advance. The feeding of the filling agent 710 is carried out by positioning a nozzle section 902 of the dispenser 900 at a given location (e.g., a location P1 shown in FIG. 7) in the space between the opening section 706a and the semiconductor element 708 at first. Then, the dispenser 900 is moved along the space while the filling agent 710 is being discharged from a tip of the nozzle section 902, so as to feed the filling agent 710 to the inside of the opening section 706a. By this, the filling agent 710 is fed in the entire opening section 706a.

CITATION LIST

Patent Literatures

Patent Literature 1
Japanese Patent Application Publication, Tokukaihei, No. 11-214586 A (Publication Date: Aug. 6, 1999)
Patent Literature 2
Japanese Patent Application Publication, Tokukai, No. 2004-349399 A (Publication Date: Dec. 9, 2004)
Patent Literature 3
Japanese Patent Application Publication, Tokukai, No. 2005-175113 A (Publication Date: Jun. 30, 2005)
Patent Literature 4
Japanese Patent Application Publication, Tokukai, No. 2009-4710 A (Publication Date: Jan. 8, 2009)

SUMMARY OF INVENTION

Technical Problem

However, the aforementioned conventional art cannot suitably feed a resin in a space between the semiconductor element and the substrate without causing a failure such as failing to fill the space, filling with an air cell, or the like failure. For example, in the conventional art, when a material of an insulating protective film is provided on the substrate and cured, the material of the insulating protective film is shrunk by the curing. In the conventional art, because the insulating protective film is provided only on one side surface of the substrate, the substrate is curled or waved as the insulating protective film is shrunk by the curing. A space between the semiconductor element and the substrate to which the resin is fed is as small as 10 µm to 30 µm. On this account, if the substrate is curled or waved, the resin cannot be appropriately fed in the entire space. As a result, the failure such as failing to fill the space, filling with an air cell, or the like failure is caused in the space between the semiconductor element and the substrate. Such failure causes deterioration in reliability of a semiconductor device, such as a decrease in strength of adhesion between the semiconductor element and the substrate, or the like.

An object of the present invention is to provide a semiconductor device and a method for manufacturing the same, in each of which it is possible that a filling agent fills a gap between a semiconductor element and a tape base material without causing a failure such as failing to fill the space, filling with an air cell, or the like failure.

Solution to Problem

In order to attain the object, a semiconductor device of the present invention is a semiconductor device, which is a tape carrier semiconductor device including a semiconductor element provided on a top surface of a tape base material so as to be electrically connected with a wiring pattern provided on the top surface of the tape base material, the semiconductor device including: a top-side insulating protective film covering the top surface of the tape base material; and a reverse-side insulating protective film covering a reverse surface of the tape base material, the top-side insulating protective film having (i) a top-side opening section opening in at least a part of a region where the top surface of the tape base material faces the semiconductor element and (ii) a protruding opening section outwardly extending from the region, the reverse-side insulating protective film having a reverse-side opening section opening on a reverse side below the top-side opening section, an opening of the reverse-side opening section being 1.00 time to 8.50 time larger in an area than the region where the top surface of the tape base material faces the semiconductor element, and a filling agent filling a gap between the semiconductor element and the tape base material in the region where the top surface of the tape base material faces the semiconductor element.

With the arrangement, the insulating protective films shrink on the respective top and reverse sides of the tape base material when they are cured. As such, it is possible to offset curling caused on a top surface side of the tape base material with curling caused on a reverse surface side of the tape base material. This is very advantageous to manufacturing of the tape carrier semiconductor device. That is, in the manufacturing of the tape carrier semiconductor device, in which (i) the semiconductor element is mounted, after formation of the insulating protective films, in the top-side opening section (the inner lead section) covered with no insulating protective film, and then (ii) the filling agent is fed in between the semiconductor element and the top-side opening section, that is, in which the top-side opening section for mounting of the semiconductor element is necessary, it is required to prevent the tape base material from being curled in a region where the top-side opening section is provided. However, if the insulating protective film is formed on the entire reverse surface of the tape base material without having the reverse-side opening section, then the tape base material is curled one-sidedly in the top-side opening section. In view of this, the reverse-side opening sections are provided in the arrangement, so as to enable avoiding such a situation. As a result, it becomes possible that the filling agent is suitably fed to the entire space between the semiconductor element and the tape base material.

Further, the positioning mark (of a cruciform, an L-shaped form, etc.), in accordance with which the semiconductor element is positioned, is provided on the top surface of the tape base material in the space part between the semiconductor element and the peripheral part of the top-side opening section. However, if the reverse surface of the tape base material is covered with the reverse insulting protective film in a region on the reverse side below the positioning mark, then a problem is caused to positioning of the semiconductor element. As a countermeasure to this, it is arranged such that the opening of the reverse-side opening section is set to a size at least 1.00 time larger than the area of the region where the top surface of the tape base material faces the semiconductor element. Because this enables avoiding a risk that the reverse surface of the tape base material is covered with the reverse-side insulating protective film in the region on the reverse side below the positioning mark, it is possible to perform the positioning of the semiconductor element without causing the problem.

Also, because the opening of the reverse-side opening section is thus 1.00 time to 8.50 times larger in the area than the region where the tape base material faces the semiconductor element, it is possible to (i) avoid interference that, when a reverse side of the semiconductor device is fixed, a device jig and the reverse-side insulating protective film interfere with each other and (ii) prevent the curling of the tape base material.

A method of the present invention for manufacturing a semiconductor device is a method for manufacturing a tape carrier semiconductor device including a semiconductor element provided on a top surface of a tape base material so as to be electrically connected with a wiring pattern provided on the top surface of the tape base material, the method including the steps of: forming a top-side insulating protective film covering the top surface of the tape base material, wherein the step of forming the top-side insulating protective film forms the top-side insulating protective film which has (i) a top-side opening section opening in at least a part of a region where the top surface of the tape base material faces the semiconductor element and (ii) a protruding opening section outwardly extending from the region; and forming a reverse-side insulating protective film covering a reverse surface of the tape base material, wherein the step of forming the reverse insulting protective film forms the reverse-side insulating protective film which has a reverse-side opening section opening in a reverse side of the top-side opening section, an opening of the reverse-side opening section being 1.00 time to 8.50 times larger in an area than the region where the top surface of the tape base material faces the semiconductor element; and feeding a filling agent through the protruding opening section to the region where the top surface of the tape base material faces the semiconductor element.

The arrangement can bring about, in manufacturing of the semiconductor device, an effect similar to the effect brought about by the semiconductor device of the present invention as early described.

Advantageous Effects of Invention

In each of a semiconductor device of the present invention and a method of the present invention for manufacturing the same, it is possible that a filling agent fills a gap between a semiconductor element and a tape base material without causing a failure such as non-filling, formation of an air bubble, or the like.

BRIEF DESCRIPTION OF DRAWINGS

FIG. 6 is a view showing a top side of a semiconductor device in accordance with Embodiment 4.

DESCRIPTION OF EMBODIMENTS

Embodiments 1 to 4 of the present inventions are described below with reference to the figures.

Embodiment 1

Figure 1:
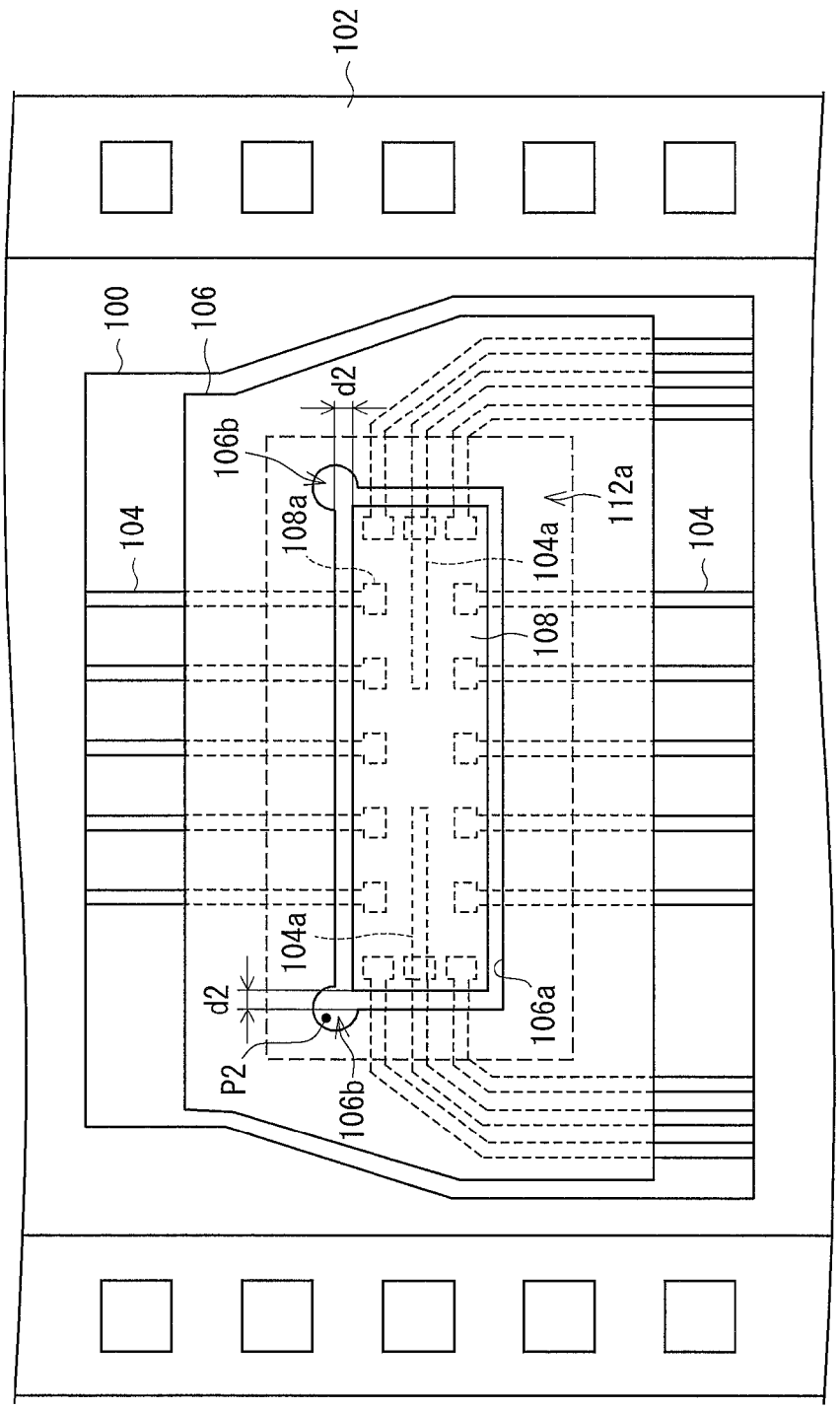
FIG. 1 is a view showing a top side of a semiconductor device in accordance with Embodiment 1.
Figure 2:
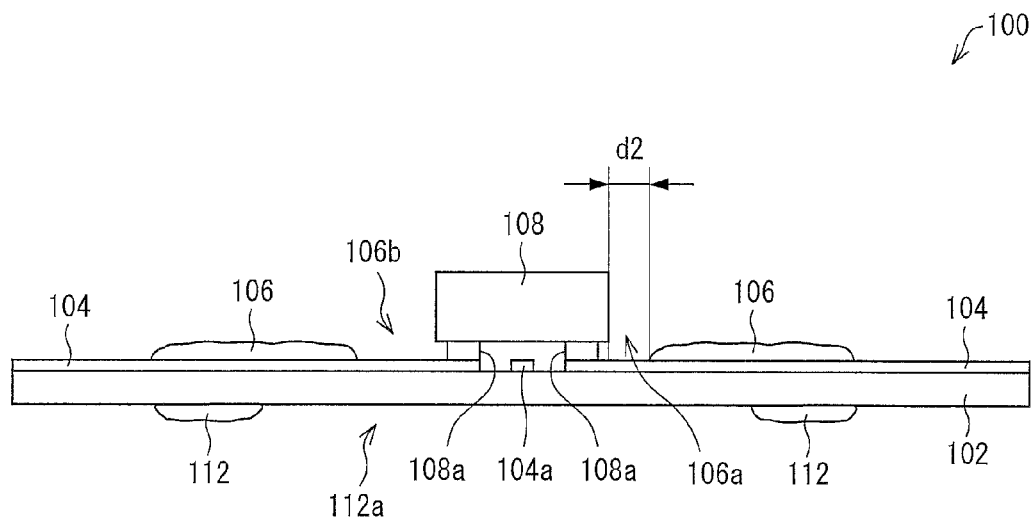
FIG. 2 is a view showing a lateral cross section of the semiconductor device in accordance with Embodiment 1.

FIG. 1 is a view showing a top side of a semiconductor device 100 in accordance with Embodiment 1 of the present invention. FIG. 2 is a view showing a lateral cross section of the semiconductor device 100 in accordance with Embodiment 1.

FIG. 1 shows only one semiconductor device 100. However, in reality, two or more semiconductor devices 100 are arranged at regular intervals on a tape base material 102 in a direction in which the tape base material 102 is extended. One semiconductor device 100 out of the two or more semiconductor devices 100 is hereinafter described. The rest of the two or more semiconductor devices 100 are similar to the semiconductor device 100 described below, and their explanation is omitted.

<Arrangement of Semiconductor Device>

The semiconductor device 100 of Embodiment 1 is a tape carrier semiconductor device and includes the tape base material 102, a wiring pattern 104, a top-side insulating protective film 106, a semiconductor element 108, a filling layer 110, and a reverse-side insulating protective film 112.

Tape Base Material 102

The tape base material 102 is a so-called flexible substrate having flexibility. An insulant having flexibility is used as a material of the tape base material 102. A material such as a polyimide film having a tape-like shape of a thickness of 12 μm to 50 μm or the like can be employed as the tape base material 102, for example.

Semiconductor Element 108

Figure 3:
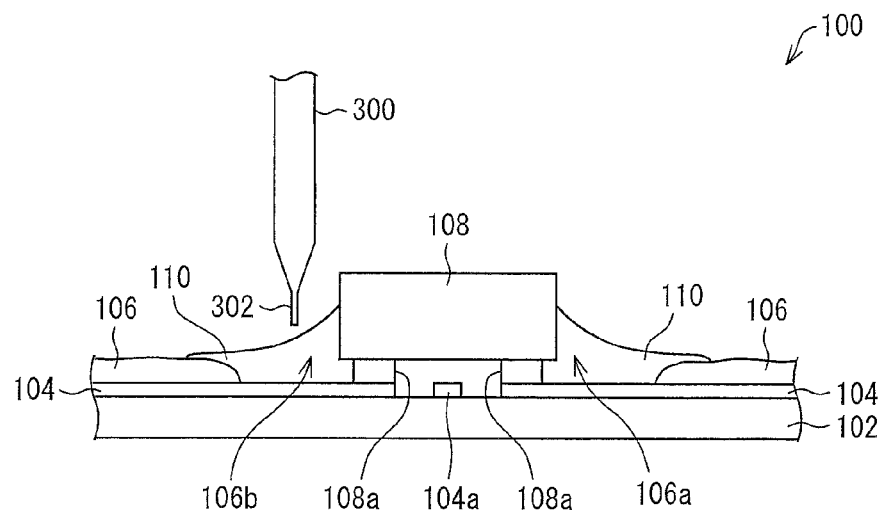
FIG. 3 is a view showing, in an enlarged size, the lateral cross section of the semiconductor device in accordance with Embodiment 1.

The semiconductor element 108 is an element provided on the tape base material 102. As shown in FIG. 3, (i) the semiconductor element 108 has an electrode 108a provided on a surface facing the tape base material 102, and (ii) the electrode 108a is electrically connected, by use of a metal bump or the like, with a terminal of the wiring pattern 104 which is provided on the tape base material 102. As the semiconductor element 108, a conventional and well-known semiconductor element can be used. For example, a display driver can be used as the semiconductor element 108 of the present invention, in a case where the semiconductor device 100 is used to serve as driving means of an image display device.

Wiring Pattern 104

The wiring pattern 104 is provided on the surface of the tape base material 102. The wiring pattern 104 is provided for electrically connecting the semiconductor element 108 with an external device (which is not shown). In a case where the display driver is used as the semiconductor element 108, as described above, the wiring pattern 104 provided on the tape base material 102 can electrically connect the display driver with display means corresponding to the external device.

A part of the wiring pattern 104 is covered with the top-side insulating protective film 106, as later described. Specifically, the wiring pattern 104 is covered with the top-side insulating protective film 106, except for (i) a part to which the electrode 108a of the semiconductor element 108 is electrically connected and (ii) a part near the part (i). The parts (i) and (ii) of the wiring pattern 104 thus covered with no top-side insulating protective film 106 (i.e., exposed parts) are sometimes referred to as inner lead sections of the wiring pattern 104.

Further, the following parts (iii) and (iv) of the wiring pattern 104 are covered with no top-side insulating protective film 106, (iii) an end part for connecting with an external terminal, which end part is provided on an side opposite to a side on which the semiconductor element 108 is provided, and (iv) a part near the end part (iii). The parts (iii) and (iv) of the wiring pattern 104 thus covered with no top-side insulating protective film 106 (i.e., exposed parts) are sometimes referred to as outer lead sections of the wiring pattern 104.

Extending Section 104a

A part of the inner lead sections of the wiring pattern 104 has an extending section 104a which extends inwardly from (i) a connection part of the part of the inner lead sections and the semiconductor element 108 toward (ii) a central part of the top-side opening section 106a. More specifically, the extending section 104a extends from (i) a region to which the electrode 108a of the semiconductor element 108 is located to approximately (ii) a center of the top-side opening section 106a.

The extending section 104a thus provided makes it possible that the filling agent 110, which is fed into the top-side opening section 106a, flows along the extending section 104a to the entire top-side opening section 106a. That is, in the semiconductor device 100 of Embodiment 1, it is easy that the filling agent 110 flows to an inner part of the top-side opening section 106a in a space between the semiconductor element 108 and the tape base material 102. It follows that in the semiconductor device 100 of Embodiment 1, the filling agent 110 can more suitably fill the space between the semiconductor element 108 and the tape base material 102.

In the semiconductor device 100 of Embodiment 1, the extending section 104a has a line width of 0.05 mm to 0.20 mm. This is based on the following reason.

In the semiconductor device 100 of Embodiment 1, the extending section 104a is used to serve also as a power supply line.

Because of this, if the line width of the extending section 104a is thinner than 0.05 mm, then there is a risk that the extending section 104a is burned by a voltage applied thereto, because the extending section 104a is not tolerant against power caused in the extending section 104a by the voltage.

On the other hand, if the line width of the extending section 104a is wider than 0.20 mm, then a surface area of the extending section 104a is increased to such a value that a reduction in a size of the semiconductor device 100 is hindered.

Moreover, if the line width of the extending section 104a is wider than 0.20 mm, then the surface area of the extending section 104a is increased, whereas an area of an exposed part of the tape base material 102 in the top-side opening section 106a is decreased. Generally, a filling agent which is used to seal a semiconductor element has a greater adhesiveness to an exposed part of a tape base material than to a surface of a wiring pattern.

On this account, such a larger surface area of the extending section 104a in the top-side opening section 106a leads to easy exfoliation of the filling agent 110.

In essence, in the semiconductor device 100 of Embodiment 1, the extending section 104 is set to the line width of 0.05 mm to 0.20 mm which is the most suitable in view of (i) preventing of the burning of extending section 104a and (ii) improving an effect to prevent exfoliation of the filling agent 110.

However, the extending section 104a is not limited to the line width of 0.05 mm to 0.20 mm. It may be set to a line width of thinner than 0.05 mm or a line width of wider than 0.20 mm.

The extending section 104a is not limited to the arrangement that one end of the extending section 104a is in contact with the electrode 108a and the other end of the extending section 104a is disconnected (see FIG. 1 and the like). The extending section 104a may be freely arranged, i.e., both of the ends of the extending section 104a may be in contact with the electrode 108a, or the like.

Top-Side Insulating Protective Film 106

The top-side insulating protective film 106 covers a part of the top surface of the tape base material 102 on which the wiring pattern 104 is provided. The top-side insulating protective film 106 mainly has a role on preventing patterns in the wiring pattern 104 from being in contact with each other to be short-circuited, or the like. Accordingly, the top-side insulating protective film 106 is made from an insulating material.

The top-side insulating protective film 106 is a so-called solder resist. A material such as a melamine resin, an epoxy resin, a polyimide resin, etc. can be used as the top-side insulating protective film 106, for example.

Further, the top-side insulating protective film 106 has the top-side opening section 106a that opens in a region where the top surface of the tape base material 102 faces the semiconductor element 108.

Top-Side Opening Section 106a

In Embodiment 1, the top-side opening section 106a has a shape substantially similar to an outer shape of the semiconductor element 108. Specifically, because the outer shape of the semiconductor element 108 has a rectangular shape (see FIG. 1), the top-side opening section 106a has a rectangular shape substantially similar to the rectangular shape of the outer shape of the semiconductor element 108.

The top-side opening section 106a is thus provided. With this, the inner lead sections of the wiring pattern 104 are exposed as early described. As such, the electrode (bump) 108a of the semiconductor element 108 is electrically connected with terminals of the inner lead sections of the wiring pattern 104 in the top-side opening section 106a.

In the semiconductor device 100 of Embodiment 1, the top-side opening section 106a is slightly larger in a size than the semiconductor element 108, as shown in FIG. 1. Specifically, each side of the rectangular shape of the top-side opening section 106a is slightly longer in a length than a corresponding side of the rectangular shape of the outer shape of the semiconductor element 108.

In particular, each side of the rectangular shape of the top-side opening section 106a is longer in the length, by a range of not greater than 0.50 mm, than the corresponding side of the rectangular shape of the outer shape of the semiconductor element 108. With this, a space d2 between a peripheral part of the top-side opening section 106a and a peripheral part of the semiconductor element 108 is set to 0.25 mm or smaller. This is based on the following reason.

However, it is preferable that the size of the top-side opening section 106a is set to as small a size as possible, while being maintained to be larger than the size of the semiconductor element 108. This is because, the larger the size of the top-side opening section 106 is, the larger an area of a line region which is covered with no insulating cover prior to providing of the semiconductor element 108 on the tape base material 102 is. With the line region thus being large in the area, there is an increased risk for a problem such as short-circuit caused by adhesion of an electrically conductive foreign material, or the like.

However, the space d2 is thus intentionally provided. As such, it is possible that a position mark (of a cross shape, an "L"-like shape, etc.), in accordance with which the semiconductor element 108 is positioned, is provided in the space d2. This makes it possible to position the semiconductor element 108 with an increased position accuracy.

Further, because the space d2 is thus provided, it is also possible to suitably cover a lateral side surface of the semiconductor element 108 with the filling agent 110. This can set a strength of adhesion of the semiconductor element 108 to a more suitable value.

For the reason, it is preferable that the semiconductor device 100 of Embodiment 1 is arranged such that the space d2 is provided and is set to a width of up to 0.2 mm. Further, it is preferable that the space d2 is set to a width of up to 0.25 mm so as to be capable of bearing a common difference of 0.05 mm in the size of the top-side opening section 106a.

In the semiconductor device 100 of Embodiment 1, the space d2 is thus very narrow. That is, the top-side opening section 106a is set to as small a size as possible, while being maintained to be larger than the semiconductor element 108. With this, the semiconductor element 100 of Embodiment 1 can prevent various problems causable if the top-side opening section 106a is set to a very large size, such as consumption of more than a required amount of the filling agent 110, and the like.

The filling agent 110 is fed through a protruding opening section 106b, as early described. As such, the narrow width of the space d2 will not lead to difficulty in feeding of the filling agent, or the like problem.

Protruding Opening Section 106b

In Embodiment, the protruding opening section 106b, which has a substantially circular shape, is provided in each of the following corner parts (i) and (ii) of the top-side opening section 106a in such a manner as to extend locally in an outward direction from a central part of the top-side opening section 106a; (i) a corner part which is close to an upper left corner of FIG. 1 and (ii) a corner part which is close to an upper right corner of FIG. 1. With this, the filling agent 110 can be fed by being fed through the protruding opening section 106b, as later described in relation with a manufacturing process.

The semiconductor device 100 of Embodiment 1 is such that a furthest part of the protruding opening section 106b, which furthest part is furthest from an end part of a region where the tape base material 102 faces the semiconductor element 108, is away in an outward direction from the end part of the region by a distance of 0.4 mm to 0.1 mm. This is based on the following reason.

When the filling agent 110 is fed, the dispenser 300 is used so as to discharge the filling agent 110 from a nozzle section 302 into the protruding opening section 106b (see FIG. 3).

Generally, a nozzle section of a dispenser used to feed the filling agent 110 has an inner diameter of about 0.25 mm. The nozzle section 302 of Embodiment 1 is not an exception to this. It follows that an inner diameter of the nozzle section 302 is about 0.25 mm.

Because of this, if the furthest part of the protruding opening section 106b is away from the end part of the region by a distance of less than 0.4 mm, then it is difficult to position the nozzle section 302 at a location where the filling agent 110 is fed. Further, if the nozzle section 302 touches the semiconductor element 108, then the feeding agent 110 cannot be successively fed.

In view, the semiconductor device 100 of Embodiment 1 is such that the distance between the furthest part of the protruding opening section 106b and the end part of the region is at least 0.4 mm.

However, if the distance is greater than 1.0 mm, then the area of the line region covered with no insulating component is increased. Consequently, there is an increased risk of having problems such as short-circuit caused by adhesion of an electrically conductive foreign material, disconnection due to an insufficient strength of a line part, and the like.

In view, the semiconductor device 100 of Embodiment 1 is arranged such that the distance between the furthest part of the protruding opening section 106b and the end part of the region is 1.0 mm or less.

That is, in the semiconductor device 100 of Embodiment 1, the distance between the furthest part of the protruding opening section 106b and the end part of the region is 0.4 mm to 1.0 mm, which is suitable in view of (i) improving of an easiness to feed the filling agent 110 and (ii) preventing the problem caused by the increase in the line region.

However, the distance between the furthest part of the protruding opening section 106b and the end part of the region is not limited to 0.4 mm to 1.0 mm. That is, the scope of the present invention does not exclude an aspect that the distance between the furthest part of the protruding opening section 106b and the end part of the region is less than 0.4 mm or greater than 1.0 mm.

That is, it is suitable that the protruding opening section 106b is such that the space between the protruding opening section 106b and the semiconductor element 108 forms a space large enough for the filling agent 110 to be fed.

In the Specification, "an end part of a region where the tape base material 102 faces the semiconductor element 108" means a part substantially same as a contour of the semiconductor element 108 shown in a top view of the semiconductor device 100 in FIG. 1.

It is not necessary that the entire nozzle section 302 is located within the protruding opening section 106b when the filling agent 110 is fed. It is suitable that 50% or more of the inner diameter of the nozzle section 302 is located within the protruding opening section 106b.

Filling Agent 110

The filling agent 110 is fed, as shown in FIG. 3, with respect to the semiconductor device 100 shown in FIGS. 1 and 2. FIG. 3 is a view showing, in an enlarged size, the lateral cross section of the semiconductor device 100 of Embodiment 1 to which the filling agent 110 has been fed.

After providing of the semiconductor element 108 on the tape base material 102, the filling agent 110 is fed through the top-side opening section 106a provided above the tape base material 102. The filling agent 110 mainly serves to (i) improve the strength of adhesion between the semiconductor element 108 and the tape base material 102, (ii) protect the surface of the semiconductor element electrode 108a of the semiconductor element 108, (iii) prevent any foreign matter from entering the space between the semiconductor element 108 and the tape base material 102, and the like.

The electrode 108a of the semiconductor element 108 slightly protrudes in a downward direction (i.e., a direction approaching the tape base material 102) from a main body of the semiconductor element 108. Because of this, when the semiconductor element 108 is provided, an interface part between the semiconductor element 108 and the tape base material 102 has a very small gap. However, the filling agent 110 which is fed to the top-side opening section 106a enters, by capillary action, the gap in the top-side opening section 106a and thereby fills the gap.

The filling agent 110 is stemmed by the peripheral part of the top-side opening section 106a, i.e., a step caused between the tape base material 102 and the top-side insulating protective film 106. As such, the filling agent 110 is held along the peripheral part of the top-side opening section 106a and kept from easily flowing to an outside of the top-side opening section 106a.

In this case, the filling agent 110 coats lateral sides of the semiconductor element 108 in a fillet shape in the space between the top-side opening section 106a and the semiconductor element 108.

The filling agent 110 is made from a material having both flowing and insulating properties. An epoxy resin can be used as the filling agent 110, for example. It is preferable that the filling agent 110 is made from a material which is thermally or optically curable in reaction to heating or irradiation with ultraviolet light or the like.

A thin film, which is formed by the filling agent 110 and has a thickness of 5 μm to 30 μm, is provided on the top-side insulating protective film 106 in a region (i) surrounding the top-side opening section 106a and (ii) outwardly extending from the top-side opening section 106a by 2 mm to 3 mm.

A part of the filling agent 110 which has spread in the entire top-side opening section 106a overflows, in some cases, the peripheral part of the top-side opening section 106a onto a top part of the top-side insulting protective film 106 during a filling-agent feeding process (which is later described). In the semiconductor device 100 of Embodiment 1, this phenomenon is made use of to form such a thin film.

This strengthens a part surrounding the top-side opening section 106a, and thereby improves the semiconductor device 100 in tolerance against forces causing disconnection, such as a force applied onto the wiring pattern 104.

Some of filling agents which are used to seal semiconductor element are shed by top-side insulting protective films, whereas others of the filling agents have an affinity to be spreadable on the top-side insulating protective films. In the semiconductor device 100 of Embodiment 1, the filling agent 110 with affinity to the top-side insulating protective film 106 is used. On this account, even in a case where the filling agent 110 spreads to the top part of the top-side insulating protective film 106, as described above, the filling agent 110 merely forms the thin film of the thickness of 5 μm to 30 μm. As such, the semiconductor device 100 maintains flexibility as a tape carrier semiconductor device, and is thereby able to be used without any problem.

Reverse-Side Insulating Protective Film 112

As shown in FIG. 2, the semiconductor device 100 of Embodiment 1 further includes the reverse-side insulting protective film 112.

The reverse-side insulating protective film 112 covers a reverse surface of the tape base material 102. The reverse-side insulating protective film 112 mainly serves to prevent the tape base material 102 from being curled one-sidedly. Further, in a case where electrically conductive members, such as a wiring pattern, a metal terminal, etc., are provided on the reverse surface of the tape base material 102, the reverse-side insulating protective film 112 also serves to prevent the electrically conductive members from being in contact with each other to be short-circuited, and the like. From this perspective, it is preferable that the reverse-side insulating protective film 112 is, like the top-side insulating protective film 106, made from an insulating material such as a melamine resin, an epoxy resin, a polyimide resin, or the like.

Further, as shown in FIGS. 1 and 2, the reverse-side insulating protective film 112 has a reverse-side opening section 112a provided on a reverse side below the top-side opening section 106a. In Embodiment 1, the reverse-side opening section 112a has a shape substantially same as both of the outer shape of the semiconductor element 108 and the outer shape of the top-side opening section 106a. Specifically, because both of the outer shape of the semiconductor element 108 and the outer shape of the top-side opening section 106a have rectangular shapes (see FIG. 1), the reverse-side opening section 112a has a rectangular shape.

In the semiconductor device 100 of Embodiment 1, the reverse-side insulating protective film 112 having the reverse-side opening section 112a is thus provided on the reverse surface of the tape base material 102. Because both of the insulating protective films provided on the respective top and reverse surfaces of the tape base material 102 are hardened and constricted, it is possible to offset curling caused on the top side of the tape base material 102 with curling caused on the reverse side of the tape base material 102. This can prevent the table base material 102 from being curled one-sidedly.

In particular, the reverse-side opening section 112a is arranged so as to be 1.00 to 8.50 times larger than the region where the semiconductor element 108 faces the reverse-side opening section 112a. This is based on the following reason.

Normally, a positioning mark (of a cruciform, an "L" shape, etc.), in accordance with which a semiconductor element is positioned, is marked on a top surface of a tape base material in a space part between a semiconductor element and a peripheral part of a top-side opening section. However, if a reverse surface of a tape base material is covered with a reverse-side insulating protective film on a reverse side below the positioning mark, then there is a problem in positioning of the semiconductor element.

In the semiconductor device 100 of Embodiment 1, the reverse-side opening section 112a is at least 1.00 time larger than the region where the semiconductor element 108 faces the reverse-side opening section 112a. This can prevent the reverse surface of the tape base material 102 from being covered with the reverse-side insulating protective film 112 on the reverse side below the positioning mark. As such, it is possible to perform the positioning of the semiconductor element 108 without a problem.

Further, the reverse-side opening section 112a is set to a size of 8.50 times, at maximum, larger than the region where the semiconductor element 108 faces the tape base material 102. This enables (i) avoiding interference between a device jig and the reverse-side insulating protective film 112a when a reverse side of the semiconductor device 100 is fixed, and (ii) preventing the curling of the tape base material 102. That is, if the reverse-side opening section 112a is set to a size of more than 8.50 times larger than the region, then it is impossible to offset the curling of the tape base material 102 on the top side with curling of the tape base material 102 on the reverse side. Further, in this case, the reverse-side opening section 112a becomes equal to or larger than a region punched out by a metal die so as to correspond to an outer shape of the semiconductor element, so that the tape base material 102 is curled after punching.

On this account, it is necessary that the reverse-side opening section 112a is set to the size of 1.00 time to 8.50 times larger than the region where the semiconductor element 108 faces the tape base material 102.

The following describes one example of a process for manufacturing the semiconductor device 100 in accordance with Embodiment 1.

Wiring Pattern Forming Step

First, the wiring pattern 104 is formed on the top surface of the tape base material 102. The wiring pattern 104 is formed by (i) forming a copper foil on the tape base material 102 by laminating or sputtering and then (ii) performing an etching treatment to the copper foil thus formed.

Top-Side Insulating Protective Film Forming Step

Then, the top-side insulating protective film 106 is formed above the top surface of the tape base material 102 on which the wiring pattern 104 has been formed. In this case, the top-side insulating protective film 106 is formed by applying a material to the above of the top surface of the tape base material 102 except for regions where the inner and outer lead sections of the wiring pattern 104 are formed, in such a manner that the top-side opening section 106a is formed in the top-side insulating protective film 106 in the region where the semiconductor element 108 faces the tape base material 102. Thereafter, the top-side insulating protective film 106 formed above the top surface of the tape base material 102 is cured by a curing treatment suitable for a material of the top-side insulating protective film 106, such as thermal curing, optical curing, or the like.

Reverse-Side Insulating Protective Film Forming Step

Then, the reverse-side insulating protective film 112 is formed on the reverse surface of the tape base material 102. In this case, the reverse-side insulating protective film 112 is formed by applying a material to the reverse surface of the tape base material 102 except for a region where the reverse-side opening section 112a is formed. Thereafter, the reverse-side insulating protective film 112 thus formed on the reverse surface of the tape base material 102 is cured by a curing treatment suitable for a material of the reverse-side insulating protective film 112, such as thermal curing, optical curing, or the like.

Semiconductor Element Providing Step

Then, the semiconductor element 108 is provided above the tape base material 102 so that the electrode 108a of the semiconductor element 108 is electrically connected with the wiring pattern 104. In this case, the semiconductor element 108 is positioned in accordance with an alignment mark provided on the tape base material 102.

A surface of the wiring pattern 104 is covered, with a tin or gold plate, at least in a region where the wiring pattern 104 is electrically connected with the semiconductor element 108. The wiring pattern 104 thus covered is heated from the reverse surface of the tape base material 102, and the electrode 108a of the semiconductor element 108 is pressed against the wiring pattern 104 thus heated. This fixes, by formation of an eutectic alloy of gold and tin, the electrode 108a of the semiconductor element 108 to the corresponding wiring pattern 104 so that they are electrically connected with each other. That is, the semiconductor element 108 is electrically connected with the wiring pattern 104 and fixed to the tape base material 102.

Filling Agent Feeding Step

Then, the filling agent 110 is fed. The dispenser 300, which is a conventional and well known dispenser, is used for feeding the filling agent 110. The dispenser 300 is loaded with a sufficient amount of the filling agent 110 in advance.

When the filling agent 110 is fed, the nozzle section 302 of the dispenser 300 is located, at first, at the given location (e.g., the location P2 shown in FIG. 1) within the protruding opening section 106b. Then, the filling agent 110 is discharged from the tip of the nozzle section 302 so as to be fed to the inside of the protruding opening section 106b.

In Embodiment 1, that part of the protruding opening section 106, which is furthest from the region where the semiconductor element 108 faces the tape base material 102, extends from this region by a distance of 0.4 mm to 1.0 mm. As such, when the filling agent 110 is fed, it can be fed through the protruding opening section 106b. In this case, because it is only necessary that the nozzle section 302 of the dispenser 300 is located at least within the protruding opening section 106b, it is possible to easily perform positioning of the nozzle section 302 of the dispenser 300. Further, this provides sufficient allowance for an error in positioning of the nozzle section 302 of the dispenser 300.

The filling agent 110 has fluidity, as early described. As such, when entering the inside of the top-side opening section 106a from the protruding opening section 106b, the filling agent 110 spreads, by capillary action, in the space between the semiconductor element 108 and the tape base material 102 to the entire top-side opening section 106a.

Embodiment 2

Embodiment 2 is described below only as to what is different from Embodiment 1. Therefore, for easy explanation, members having functions like the members employed in Embodiment 1 are given like reference signs, and their explanation is omitted.

Figure 4:
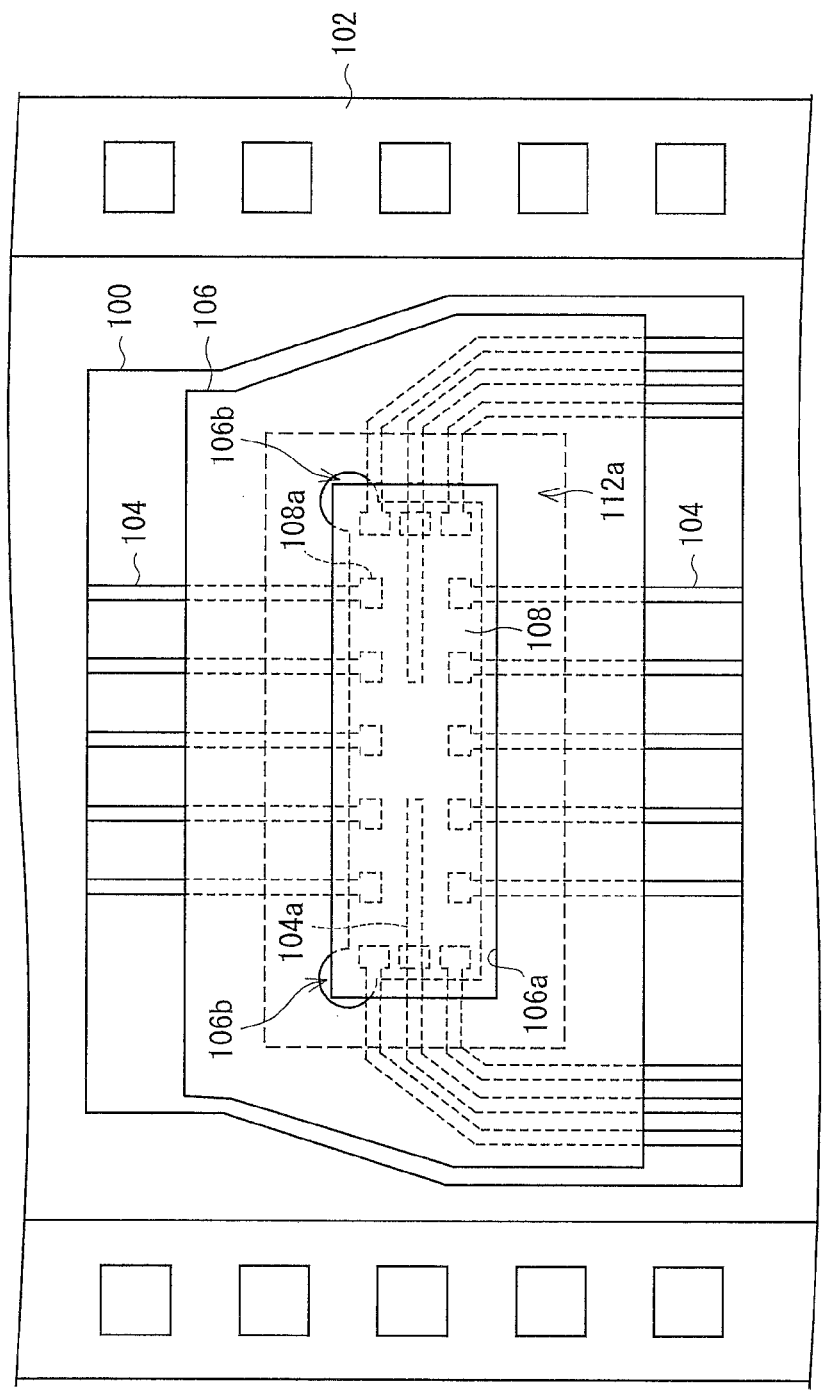
FIG. 4 is a view showing a top side of a semiconductor device in accordance with Embodiment 2.

FIG. 4 is a view showing a top side of a semiconductor device 100 in accordance with Embodiment 2. The semiconductor device 100 of Embodiment 2 is different from the semiconductor device 100 of Embodiment 1 in that a top-side opening section 106a is smaller than a surface of a semiconductor element 108 which surface faces a tape base material 102.

Specifically, each side of a rectangular shape of the top-side opening section 106a is slightly shorter in length than a corresponding side of a rectangular shape of an outer shape of the semiconductor element 108.

The top-side opening section 106a can be set to such a small size that there is no adverse effect on an electric connection between an electrode 108a of the semiconductor element 108 and an inner lead section of a wiring pattern 104.

The top-side opening section 106a is thus set to the size smaller than a size of that surface of the semiconductor element 108 which faces the tape base material 102. With this, the semiconductor device 100 of Embodiment 2 can more securely prevent various problems causable if the top-side opening section 106a is set too large, such as consumption of more than a required amount of the filling agent 110, and the like.

The top-side opening section 106a is thus smaller than that surface of the semiconductor element 108 which faces the tape base material 102. As such, there is no space between a peripheral part of the semiconductor element 108 and a peripheral part of the top-side opening section 106a. However, even in the semiconductor device 100 of Embodiment 2, like the semiconductor device 100 of Embodiment 1, the protruding opening section 106b outwardly extends from the region where the semiconductor element 108 faces the tape base material 102. As such, it is still possible to successively feed the filling agent 110 through the protruding opening section 106b.

Modification Example

The shape and the location of the top-side opening section 106a are not limited to the shapes and the locations described in Embodiments 1 and 2. The top-side opening section 106a can have any shape and can be provided at any location, as long as the top-side opening section 106a is at least arranged such that the filling agent 110 which is fed to the top-side opening section 106a can join the semiconductor element 108 and the tape base material 102 by a suitable strength.

Also, the shape and the location of the protruding opening section 106b are not limited to the shapes and the locations described in Embodiments 1 and 2. The protruding opening section 106b can have any shape and can be provided at any location, as long as it forms at least a space wide enough for the filling agent 110 to be fed in a region away from the semiconductor element 108. However, it is preferable that the protruding opening section 106b partially has a circular shape, a rectangular shape, a polygonal shape, or another shape each of which has a size large enough for the filling agent 110 to be fed (see the examples in Embodiments 1 and 2).

Modification examples of (i) the top-side opening section 106a and (ii) the protruding opening section 106b are described below as Embodiment 3.

Embodiment 3

Figure 5:
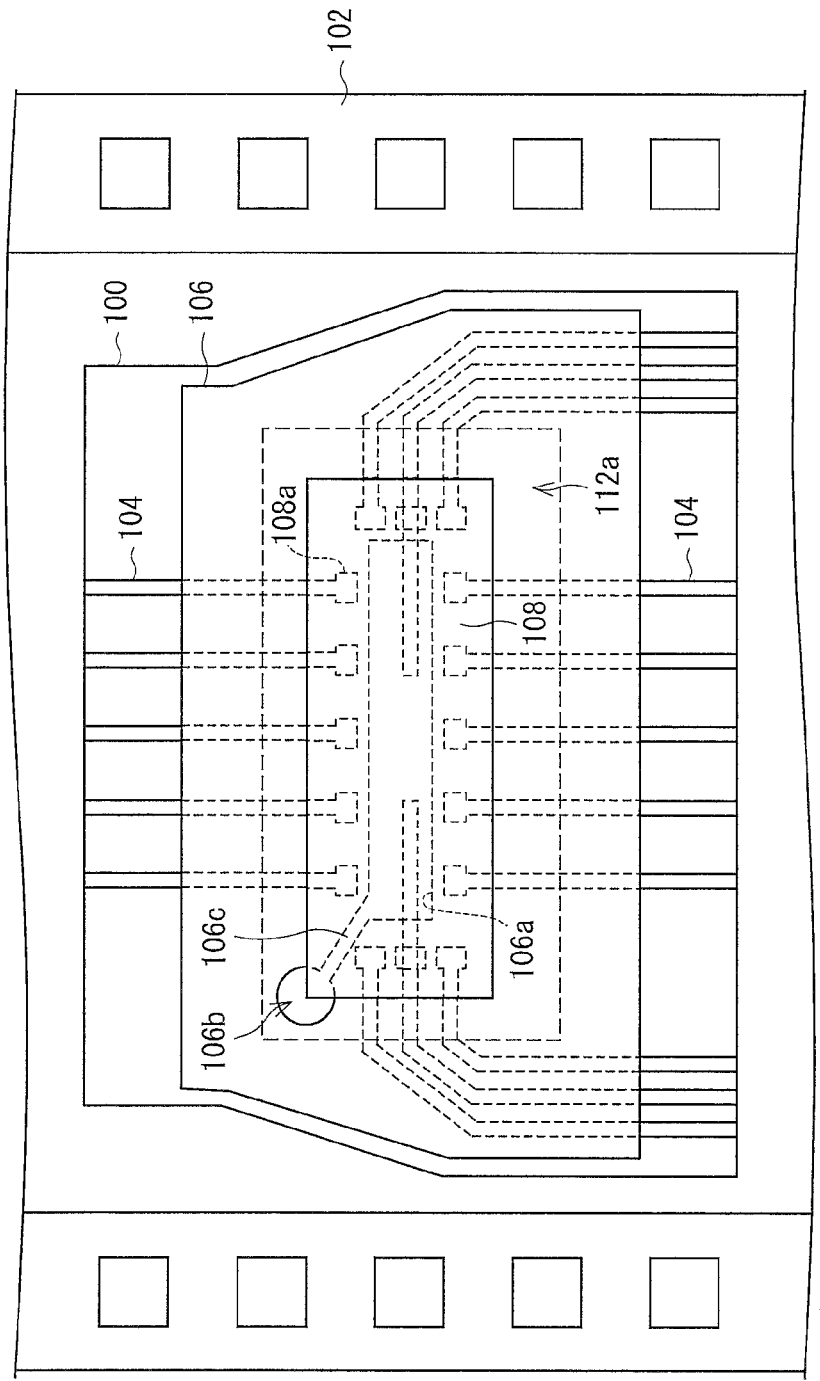
FIG. 5 is a view showing a top side of a semiconductor device in accordance with Embodiment 3.
Figure 7:
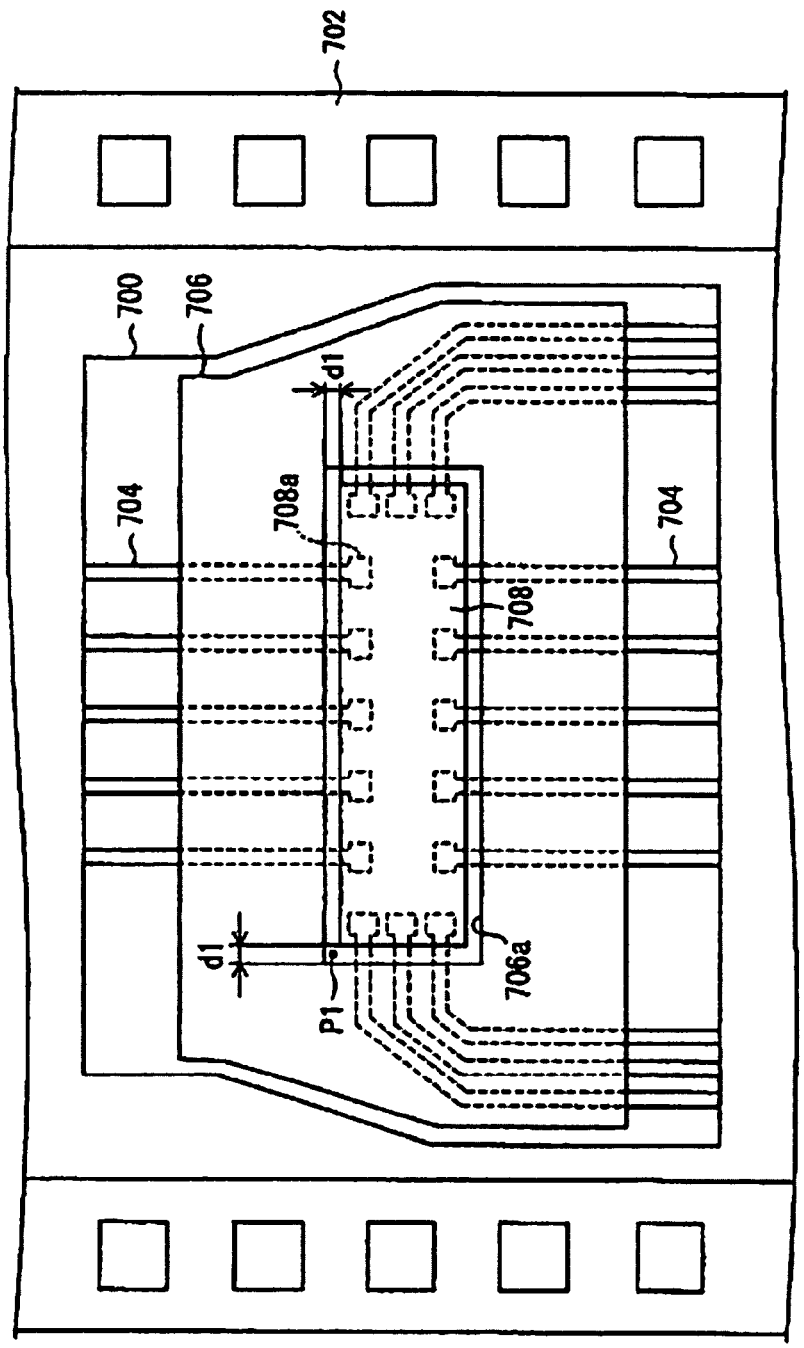
FIG. 7 is a view showing a top side of a conventional semiconductor device.
Figure 8:
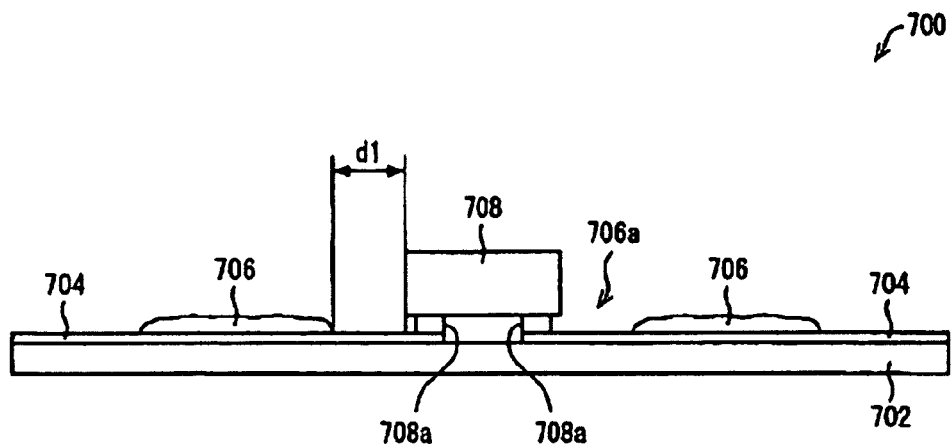
FIG. 8 is a view showing a lateral cross section of the conventional semiconductor device.
Figure 9:
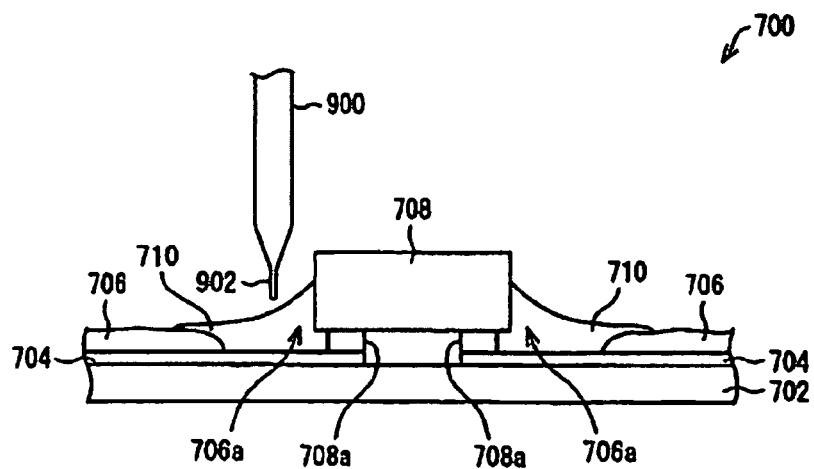
FIG. 9 is a view showing, in an enlarged size, the lateral cross section of the conventional semiconductor device.

FIG. 5 is a view showing a top side of a semiconductor device 100 in accordance with Embodiment 3. As shown in FIG. 5, the semiconductor device 100 of Embodiment 3 is same as the semiconductor device 100 of Embodiment 2 in that a protruding opening section 106b is provided near an upper left corner part of a semiconductor element 108 which upper left corner part is close to an upper left corner of FIG. 5. Meanwhile, the semiconductor device 100 of Embodiment 3 is different from the semiconductor device 100 of Embodiment 2 in that a top-side opening section 106a is further smaller than the semiconductor element 108. As such, in the semiconductor element 100 of Embodiment 3, an opening section 106c is provided in a top-side insulating protective film 106, which opening section 106c connects the top-side opening section 106a with the protruding opening section 106b and serves as an inflow path of a filling agent 110. The semiconductor device 100 of Embodiment 3 are similar to the semiconductor device 100 of Embodiment 2 except this aspect, and the semiconductor device 100 of Embodiment 3 is not described repeatedly here as to what is similar to Embodiment 2.

In the semiconductor device 100 of Embodiment 3, the top-side opening section 106a is thus smaller in area than the semiconductor element 108. With this, the semiconductor device 100 of Embodiment 3 can more securely prevent various problems causable if the top-side opening section is too large, such as consumption of more than a required amount of the filling agent 110 and the like.

Also, although the semiconductor devices 100 of respective Embodiments 3 and 2 are different in view of the shape of the opening section, they are same in that each of them includes the protruding opening section 106b which forms a space wide enough for the filling agent 110 to be fed. As such, even in the semiconductor device 100 of Embodiment 3, it is possible that the filling agent 110 is fed at any location within the protruding opening section 106b during a feeding process of the filling agent 110.

In the semiconductor device 100 of Embodiment 3, similarly to the semiconductor device 100 of Embodiment 1, the filling agent 110 is fed into the protruding opening section 106b. As such, the small size of the top-side opening section 106a does not lead to difficulty in feeding of the filling agent 110, or the like.

In the semiconductor device 100 of Embodiment 3 shown in FIG. 5, the top-side opening section 106a is thus set to the small size, so that a wiring pattern 102 is covered with a top-side insulating protective film 106 in a region where the electrode 108a of the semiconductor element 108 is connected with the wiring pattern 102. In view of this, the semiconductor element 108 is suitably pressed when being mounted, in such a manner that the electrode 108 penetrates through the top-side insulting protective film 106. This can realize electric connection between the electrode 108a and the wiring pattern 102, as one or both of them penetrate through the top-side insulating protective film 106. In the semiconductor device 100 of Embodiment 3, the top-side insulating protective film 106 has a thickness of about 10 µm, whereas the electrode 108a has a projection of about 15 µm to 20 µm. As such, it is possible to electrically connect the electrode 108a and the wiring pattern 104 in a manner thus described.

Embodiment 4

FIG. 6 is a view showing a top side of a semiconductor device 100 in accordance with Embodiment 4. As shown in FIG. 6, the semiconductor device 100 of Embodiment 4 is different from the semiconductor device 100 of Embodiment 3 in the following points (i) and (ii), (i) an entire top-side opening section 106a has a substantially circular shape and (ii) a part of the top-side opening section 106a is provided so as to extend, as a protruding opening section 106b, from a central part of a bottom side of the semiconductor element 108 which bottom side is close to a bottom of FIG. 6. The semiconductor device 100 of Embodiment 4 is similar to the semiconductor device 100 of Embodiment 3 except this aspect, and the semiconductor device 100 of Embodiment 4 is not described repeatedly here as to what is similar to Embodiment 3.

In the semiconductor device 100 of Embodiment 4, the entire top-side opening section 106a thus has the substantially circular shape, and the part of the top-side opening section 106a is thus provided so as to extend, as the protruding opening section 106b, from the central part of the bottom side of the semiconductor element 108. As such, a size of the entire top-side opening section 106a is decreased. With this, the semiconductor device 100 of Embodiment 4 can more securely prevent various problems causable if the top-side opening section 106a is too large, such as consumption of more than a required amount of the filling agent 110, or the like.

Further, the semiconductor device 100 of Embodiment 4 employs the top-side insulting protective film 106 having the opening sections provided in vicinity of a central part of a region where the semiconductor element 108 is provided. This top-side insulating protective film 106 can be employed in various semiconductor devices 100 irrespectively of differences in outer shapes of their semiconductor elements.

Although the semiconductor devices 100 of respective Embodiments 4 and 3 are different in view of the shape of the protruding opening section 106b, they are same in that each of them includes the protruding opening section 106b which forms a space wide enough for the filling agent 110 to be fed. As such, even in the semiconductor device 100 of Embodiment 4, it is possible that the filling agent 110 is fed at any location within the protruding opening section 106 during a feeding process of the filling agent 110.

In the semiconductor device 100 of Embodiment 4, similarly to the semiconductor device 100 of Embodiment 3, the filling agent 110 is fed to the protruding opening section 106b. As such, the small size of the entire top-side opening section 106a does not lead to difficulty in feeding of the filling agent 110, and the like.

Further, in the semiconductor device 100 of Embodiment 4, like the semiconductor device 100 of Embodiment 3, the top-side opening section 106a is thus set to the small size so that the wiring pattern 104 is covered with the top-side insulating protective film 106 in a region where an electrode 108a of the semiconductor element 108 is connected with the wiring pattern 104. As such, in the semiconductor device 100 of Embodiment 4, the semiconductor element 108 is suitably pressed when being mounted, so that the electrode 108a penetrates through the top-side insulting protective film 106. This can electrically connect the electrode 108a with the wiring pattern 104, as one or both of the electrode 108a and the wiring pattern 104 penetrate through the top-side insulating protective film 106. In the semiconductor device 100 of Embodiment 4, the top-side insulting protective film 106 has a thickness of about 10 µm, whereas the electrode 108a has a protrusion of about 15 µm to 20 µm. As such, it is possible to electrically connect the electrode 108a and the wiring pattern 104 in a manner thus described.

The present invention is not limited to the description of each of Embodiments 1 through 4, but may be altered by a skilled person in the art within the scope of the claims. That is, an embodiment derived from a proper combination of technical means altered within the scope of the claims is also encompassed in the technical scope of the present invention.

SUMMARY

As described above, a semiconductor device of the present invention is a tape carrier semiconductor device including a semiconductor element provided on a top surface of a tape base material so as to be electrically connected with a wiring pattern provided on the top surface of the tape base material, the semiconductor device of the present invention including: a top-side insulating protective film covering the top surface of the tape base material; and a reverse-side insulating protective film covering a reverse surface of the tape base material, the top-side insulating protective film having (i) a top-side opening section opening in at least a part of a region where the top surface of the tape base material faces the semiconductor element and (ii) a protruding opening section outwardly extending from the region, the reverse-side insulating protective film having a reverse-side opening section opening on a reverse side below the top-side opening section, an opening of the reverse-side opening section being 1.00 time to 8.50 time larger in an area than the region where the top surface of the tape base material faces the semiconductor element, and a filling agent filling a gap between the semiconductor element and the tape base material in the region where the top surface of the tape base material faces the semiconductor element.

With the arrangement, the insulating protective films shrink on the respective top and reverse sides of the tape base material when the insulating protective films are cured. As such, it is possible to offset curing caused on a top surface side of the tape base material with curling caused on a reverse surface side of the tape base material. This is very advantageous to manufacturing of the tape carrier semiconductor device. That is, according to the manufacturing of the tape carrier semiconductor device, (i) the semiconductor element is mounted, after formation of the insulating protective films, in the top-side opening section (the inner lead section) covered with no insulating protective film, and then (ii) the filling agent is fed in between the semiconductor element and the top-side opening section. That is, in order to provide the top-side opening section which is necessary for mounting of the semiconductor element, it is necessary to prevent the tape base material from being curled in a region where the top-side opening section is provided. However, if the insulating protective film is formed on the entire reverse surface of the tape base material without having the top-side opening section, then the tape base material is curled one-sidedly in the top-side opening section. In view of this, the reverse-side opening sections are provided in the arrangement, so as to enable avoiding such a situation. Therefore, it is possible that the filling agent is suitably fed to the entire space between the semiconductor element and the tape base material.

Further, the positioning mark (of a cruciform, an L-shaped form, etc.) in accordance with which the semiconductor element is positioned is provided on the top surface of the tape base material in the space part between the semiconductor element and the peripheral part of the top-side opening section. However, if the reverse surface of the tape base material is covered with the reverse insulting protective film in a region on the reverse side below the positioning mark, then a problem is caused to positioning of the semiconductor element. As a countermeasure to this, it is arranged such that the opening of the reverse-side opening section is set to a size at least 1.00 time larger than the area of the region where the top surface of the tape base material faces the semiconductor element. Because this enables avoiding a risk that the reverse surface of the tape base material is covered with the reverse-side insulating protective film in the region on the reverse side below the positioning mark, it is possible to perform the positioning of the semiconductor element without any problem.

Also, because the opening of the reverse-side opening section is thus 1.00 time to 8.50 times larger in the area than the region where the tape base material faces the semiconductor element, it is possible to (i) avoid interference that, when a reverse side of the semiconductor device is fixed, a device jig and the reverse-side insulating protective film interfere with each other and (ii) prevent the curling of the tape base material.

It is preferable that the semiconductor device of the present invention is, further to being arranged as above, arranged such that: the semiconductor element and the top-side opening section have respective rectangular shapes; and each side of the rectangular shape of the top-side opening section is shorter in a length than a combined length of (i) a length of a corresponding side of the rectangular shape of the semiconductor element and (ii) a length of 0.50 mm.

The arrangement enables preventing various problems causable if the opening of the top-side opening section is too large, such as consumption of more than required amount of the filling agent, etc., as compared with an arrangement that each side of the rectangular shape of the top-side opening section is longer in the length than the corresponding side of the rectangular shape of the semiconductor element by a length of 0.5 mm or longer.

Further, it is preferable that the semiconductor device of the present invention is, further to being arranged as early described, arranged such that the protruding opening section outwardly extends, by 0.4 mm to 1.0 mm, from an end part of the region where the top surface of the tape base material faces the semiconductor element.

With the arrangement, the filling agent can be fed in any location within the protruding opening section during a feeding process. This enables easily positioning the dispenser which feeds the filling agent, or the like. Further, even if the dispenser for feeding the filling agent, etc. is located at a position different from an intended one, it is possible to bear such a positioning error.

Further, it is preferable that the semiconductor device of the present invention is, further to being arranged as early described, arranged such that: the wiring pattern has an extending section provided in the top-side opening section provided on a top surface side of the tape base material; and the extending section has a width of 0.05 mm to 0.20 mm and extends from a connection part of the wiring pattern and the semiconductor element toward a center part of the top-side opening section.

With the arrangement, the filling agent which is fed to the inside of the top-side opening section in a liquid form flows, by surface tension, along the extending section to an inner part of the top-side opening section in the gap between the semiconductor element and the tape base material. As such, it can be easy to feed the filling agent to the inner part of the top-side opening section in the gap between the semiconductor element and the tape base material. In particular, because the extending section is set to the line width of 0.05 mm to 0.20 mm, it is possible to (i) prevent the extending section from being burned and (ii) make it difficult for the filling agent to be exfoliated.

Further, it is preferable that the semiconductor device of the present invention is arranged such that a thin film having a thickness of 5 µm to 30 µm being provided on that part of the top-side insulating protective film which (a) surrounds the top-side opening section and (b) extends from an end part of the top-side opening section by 2 mm to 3 mm.

With the arrangement, because the region surrounding the top-side opening section can be thus strengthened, it is possible to improve the semiconductor device in tolerance of the wiring pattern against forces causing disconnection thereof, such as a force applied to the wiring pattern. Further, because the thickness of the thin film is merely about 5 µm to 30 µm, a flexibility of the tape carrier semiconductor element can be maintained, thereby causing no problem when being used.

A method of the present invention for manufacturing a semiconductor element is a method for manufacturing a tape carrier semiconductor device including a semiconductor element provided on a top surface of a tape base material so as to be electrically connected with a wiring pattern provided on the top surface of the tape base material, the method including the steps of: forming a top-side insulating protective film covering the top surface of the tape base material, wherein the step of forming the top-side insulating protective film forms the top-side insulating protective film which has (i) a top-side opening section opening in at least a part of a region where the top surface of the tape base material faces the semiconductor element and (ii) a protruding opening section outwardly extending from the region; and forming a reverse-side insulating protective film covering a reverse surface of the tape base material, wherein the step of forming the reverse insulting protective film forms the reverse-side insulating protective film which has a reverse-side opening section opening in a reverse side of the top-side opening section, an opening of the reverse-side opening section being 1.00 time to 8.50 times larger in an area than the region where the top surface of the tape base material faces the semiconductor element; and feeding a filling agent through the protruding opening section to the region where the top surface of the tape base material faces the semiconductor element.

The arrangement can bring about, in manufacturing of the semiconductor device, an effect similar to the effect bought about by the semiconductor device of the present invention early described.

INDUSTRIAL APPLICABILITY

A semiconductor device of the present invention and a method of the present invention for manufacturing a semiconductor device can be applied to various semiconductor devices and various methods for manufacturing semiconductor devices, respectively, each of which (i) and (ii) employs an art of sealing, with a filling agent, an electronic component provided on a tape base material.

REFERENCE SIGNS LIST

100: semiconductor device
102: tape base material
104: wiring pattern
106: top-side insulating protective film
106a: top-side opening section
106b: protruding opening section
108: semiconductor element
108a: electrode
110: filling agent
112: reverse-side insulating protective film
112a: reverse-side opening section

The invention claimed is:

1. A semiconductor device, which is a tape carrier semiconductor device including a semiconductor element provided on a top surface of a tape base material so as to be electrically connected with a wiring pattern provided on the top surface of the tape base material, the semiconductor device comprising:
   a top-side insulating protective film covering the top surface of the tape base material; and
   a reverse-side insulating protective film covering a reverse surface of the tape base material,
   the top-side insulating protective film having (i) a top-side opening section opening in at least a part of a region where the top surface of the tape base material faces the semiconductor element and (ii) a protruding opening section outwardly extending from the region,
   the reverse-side insulating protective film having a reverse-side opening section opening on a reverse side below the top-side opening section,
   an opening of the reverse-side opening section being more than 1.00 time to not more than 8.50 times larger in an area than the region where the top surface of the tape base material faces the semiconductor element, and
   a filling agent filling a gap between the semiconductor element and the tape base material in the region where the top surface of the tape base material faces the semiconductor element.

2. The semiconductor device as set forth in claim 1, wherein:
   the semiconductor element and the top-side opening section have respective rectangular shapes; and
   each side of the rectangular shape of the top-side opening section is shorter in a length than a combined length of (i) a length of a corresponding side of the rectangular shape of the semiconductor element and (ii) a length of 0.50 mm.

3. The semiconductor device as set forth in claim 1, wherein
   the protruding opening section outwardly extends, by 0.4 mm to 1.0 mm, from an end part of the region where the top surface of the tape base material faces the semiconductor element.

4. The semiconductor device as set forth in claim 1, wherein:
   the wiring pattern has an extending section provided in the top-side opening section provided on a top surface side of the tape base material; and
   the extending section has a width of 0.05 mm to 0.20 mm and extends from a connection part of the wiring pattern and the semiconductor element toward a center part of the top-side opening section.

5. The semiconductor device as set forth in claim 1, comprising:
   a thin film having a thickness of 5 μm to 30 μm being provided on that part of the top-side insulating protective film which (a) surrounds the top-side opening section and (b) extends from an end part of the top-side opening section by 2 mm to 3 mm.

6. The semiconductor device as set forth in claim 1, wherein the protruding section has a substantially circular shape and is provided at at least one corner part of the top-side opening section.

7. The semiconductor device as set forth in claim 1, wherein the wiring pattern includes an extending section which extends inwardly from a region to which an electrode of the semiconductor element is located to a substantially center region of the top-side opening section.

* * * * *